US011230025B2

(12) United States Patent
Skrobis et al.

(10) Patent No.: US 11,230,025 B2
(45) Date of Patent: Jan. 25, 2022

(54) RAZOR BLADE

(71) Applicant: The Gillette Company, Boston, MA (US)

(72) Inventors: Kenneth James Skrobis, Maynard, MA (US); Ming Laura Xu, Natick, MA (US); Yongqing Ju, Medfield, MA (US); Bin Shen, Allston, MA (US); Matthew Robert Stone, Oxford, MA (US)

(73) Assignee: The Gillette Company LLC, Boston, MA (US)

( * ) Notice: Subject to any disclaimer, the term of this patent is extended or adjusted under 35 U.S.C. 154(b) by 802 days.

(21) Appl. No.: 14/940,858

(22) Filed: Nov. 13, 2015

(65) Prior Publication Data

US 2017/0136640 A1    May 18, 2017

(51) Int. Cl.
*B26B 21/60* (2006.01)
*B26B 21/56* (2006.01)
(Continued)

(52) U.S. Cl.
CPC .............. *B26B 21/60* (2013.01); *B26B 21/56* (2013.01); *B26B 21/565* (2013.01); *B26B 21/58* (2013.01); *C23C 16/44* (2013.01)

(58) Field of Classification Search
CPC ....... B26B 21/56; B26B 21/565; B26B 21/58; B26B 21/60
(Continued)

(56) References Cited

U.S. PATENT DOCUMENTS 3,292,478 A * 12/1966 Falk .......................... B26F 1/44
                                                                83/679
3,761,372 A    9/1973 Sastri
(Continued)

FOREIGN PATENT DOCUMENTS

EP    0363648 A1 *  4/1990  ........... C23C 14/022
GB    1097862 A     1/1968
(Continued)

OTHER PUBLICATIONS

International Search Report and Written Opinion; Application Ser. No. PCT/US2016/061231; dated Feb. 23, 2017, 10 pages.

*Primary Examiner* — Ghassem Alie
*Assistant Examiner* — Samuel A Davies
(74) *Attorney, Agent, or Firm* — Joanne N. Pappas; Kevin C. Johnson

(57) ABSTRACT

A razor blade having a substrate with a cutting edge being defined by a sharpened tip is provided where the substrate is comprised of a molybdenum (Mo) content of about 1.6% to about 5% by weight of composition and thicknesses of 1.60-1.75 μm and 9.25-10.00 μm measured at a distance of 4 and 40 μm from the blade tip, respectively. This thickness ratio is between 0.165-0.185. The substrate thickness is about 2.70-3.00 μm at 8 μm from the blade tip, about 4.44-5.00 μm at 16 μm from the blade tip with a thickness ratio measured at 4 μm and 8 μm between 0.56-0.62, and a thickness ratio measured at 4 μm and 16 μm between 0.32-0.40. The edge shape may be defined by equation $w = ad^n$ with "a" between 0.50-0.62 and "n" between 0.76-0.80. A semi-included angle less than 7° is measured at a distance of 40 μm or greater from the blade tip. This substrate will have substantially no cracks.

25 Claims, 6 Drawing Sheets

(51) Int. Cl.
*B26B 21/58* (2006.01)
*C23C 16/44* (2006.01)

(58) Field of Classification Search
USPC .................................................. 30/346.5, 357
See application file for complete search history.

(56) References Cited

U.S. PATENT DOCUMENTS

| | | | |
|---|---|---|---|
| 3,761,373 A | 9/1973 | Sastri | |
| 3,761,374 A | 9/1973 | Bromer et al. | |
| 3,811,189 A | 5/1974 | Sastri | |
| 3,834,265 A * | 9/1974 | Tafapolsky | B26D 1/00 |
| | | | 83/651 |
| 3,835,537 A | 9/1974 | Sastri | |
| 3,873,378 A | 3/1975 | Webster | |
| 4,012,551 A | 3/1977 | Bogaty et al. | |
| 4,180,420 A | 12/1979 | Alexander et al. | |
| 4,291,463 A | 9/1981 | Williams | |
| 4,416,912 A | 11/1983 | Bache | |
| 4,720,918 A | 1/1988 | Curry et al. | |
| 5,032,243 A | 7/1991 | Bache et al. | |
| 5,048,191 A | 9/1991 | Hahn | |
| 5,056,227 A | 10/1991 | Kramer | |
| 5,088,202 A | 2/1992 | Boland et al. | |
| 5,129,289 A | 7/1992 | Boland et al. | |
| 5,142,785 A | 9/1992 | Grewal et al. | |
| 5,232,568 A | 8/1993 | Parent et al. | |
| 5,263,256 A | 11/1993 | Trankiem | |
| 5,275,672 A | 1/1994 | Althaus et al. | |
| 5,295,305 A | 3/1994 | Hahn et al. | |
| 5,305,526 A | 4/1994 | Althaus | |
| 5,497,550 A | 3/1996 | Trotta et al. | |
| 5,669,144 A | 9/1997 | Hahn et al. | |
| 5,940,975 A | 8/1999 | Decker et al. | |
| 5,985,459 A | 11/1999 | Kwiecien et al. | |
| 6,105,261 A | 8/2000 | Ecer | |
| 6,151,786 A | 11/2000 | Hellstern | |
| 6,289,593 B1 | 9/2001 | Decker et al. | |
| 6,330,750 B1 | 12/2001 | Meckel | |
| 6,389,699 B1 | 5/2002 | Ecer | |
| 6,468,642 B1 * | 10/2002 | Bray | B26B 21/60 |
| | | | 428/216 |
| 6,684,513 B1 * | 2/2004 | Clipstone | B26B 21/60 |
| | | | 30/346.53 |
| 6,962,000 B2 * | 11/2005 | Teeuw | B26B 21/56 |
| | | | 30/346.5 |
| 7,060,367 B2 | 6/2006 | Yamada et al. | |
| 7,140,113 B2 | 11/2006 | King et al. | |
| 7,448,135 B2 | 11/2008 | Zhuk et al. | |
| 7,531,052 B2 | 5/2009 | Yoshiyama | |
| 7,587,829 B2 | 9/2009 | King et al. | |
| 7,785,485 B2 * | 8/2010 | Daskal | A61B 17/32 |
| | | | 216/53 |
| 7,966,909 B2 | 6/2011 | Madeira et al. | |
| 8,316,550 B2 * | 11/2012 | Howells | B26B 9/00 |
| | | | 30/350 |
| 8,359,752 B2 | 1/2013 | Bridges | |
| 8,621,757 B2 | 1/2014 | Akari et al. | |
| 8,640,344 B2 | 2/2014 | Masek et al. | |
| 9,027,443 B2 | 5/2015 | Zhuk et al. | |
| 9,079,321 B2 | 7/2015 | Claus et al. | |
| 9,180,599 B2 | 11/2015 | Papachristos et al. | |
| 9,248,579 B2 | 2/2016 | Depuydt et al. | |
| 9,446,443 B2 | 9/2016 | Masek et al. | |
| 9,751,230 B2 | 9/2017 | Skrobis et al. | |
| 9,902,013 B2 * | 2/2018 | Uemura | C23C 8/38 |
| 10,118,304 B2 | 11/2018 | Duff, Jr. et al. | |
| 10,953,558 B2 | 3/2021 | Logothetidis et al. | |
| 2002/0174549 A1 * | 11/2002 | Nakatsu | B26B 21/58 |
| | | | 30/346.54 |
| 2003/0096060 A1 | 5/2003 | Trankiem et al. | |
| 2003/0121158 A1 | 7/2003 | Clipstone et al. | |
| 2004/0172832 A1 | 9/2004 | Clipstone et al. | |
| 2005/0028389 A1 | 2/2005 | Wort et al. | |
| 2005/0126016 A1 | 6/2005 | Branden | |
| 2006/0265885 A1 | 11/2006 | Clipstone et al. | |
| 2006/0277767 A1 | 12/2006 | Sun et al. | |
| 2007/0227008 A1 | 10/2007 | Zhuk et al. | |
| 2008/0086888 A1 | 4/2008 | Scheinfeld | |
| 2010/0011595 A1 * | 1/2010 | Claus | B26B 21/56 |
| | | | 30/346.54 |
| 2010/0024222 A1 | 2/2010 | Akari et al. | |
| 2010/0107425 A1 | 5/2010 | Bykowski et al. | |
| 2010/0287781 A1 * | 11/2010 | Skrobis | B26B 21/4068 |
| | | | 30/346.54 |
| 2010/0299931 A1 | 12/2010 | Marchev et al. | |
| 2011/0010950 A1 * | 1/2011 | Madeira | C23C 16/042 |
| | | | 30/346.54 |
| 2011/0314678 A1 | 12/2011 | Peterson | |
| 2012/0060379 A1 * | 3/2012 | Culf | C23C 28/021 |
| | | | 30/350 |
| 2012/0311865 A1 | 12/2012 | Hamilton et al. | |
| 2013/0014395 A1 * | 1/2013 | Patel | B26B 21/60 |
| | | | 30/346.54 |
| 2013/0014396 A1 * | 1/2013 | Skrobis | B26B 21/60 |
| | | | 30/346.54 |
| 2013/0031794 A1 * | 2/2013 | Duff, Jr | B26B 21/60 |
| | | | 30/526 |
| 2014/0026424 A1 | 1/2014 | Oglesby et al. | |
| 2014/0230252 A1 * | 8/2014 | Davos | B26B 21/4031 |
| | | | 30/50 |
| 2014/0245865 A1 | 9/2014 | Masek et al. | |
| 2015/0328789 A1 | 11/2015 | Skrobis et al. | |
| 2016/0361828 A1 | 12/2016 | Xu et al. | |
| 2018/0043561 A1 | 2/2018 | Nisby et al. | |
| 2020/0316802 A1 * | 10/2020 | Kontokostas | B26B 21/60 |

FOREIGN PATENT DOCUMENTS

| | | |
|---|---|---|
| GB | 1179829 A | 2/1970 |
| GB | 1465697 A | 2/1977 |
| GB | 2258469 A | 2/1993 |
| JP | S5036261 A | 4/1975 |
| JP | S 62116755 | 5/1987 |
| JP | 2002294409 A | 10/2002 |
| JP | 2007245931 A | 9/2007 |
| WO | 8402104 A1 | 6/1984 |
| WO | 9935303 A1 | 7/1999 |

* cited by examiner

RAZOR BLADE

TECHNICAL FIELD

This invention relates to razors and more particularly to razor blades with sharp and durable cutting edges.

BACKGROUND

A razor blade is typically formed of a suitable substrate material such as stainless steel, and a cutting edge is formed with a wedge-shaped configuration with an ultimate tip having a radius. Hard coatings joined to the substrate, such as diamond, amorphous diamond, diamond-like carbon-(DLC) material, nitrides, carbides, oxides or ceramics are often used to improve strength, corrosion resistance and shaving ability, maintaining needed strength while permitting thinner edges with lower cutting forces to be used. Polytetrafluoroethylene (PTFE) outer layer can be used to provide friction reduction. Interlayers of niobium, chromium, or titanium containing materials can aid in improving the binding between the substrate, typically stainless steel, and hard carbon coatings, such as DLC.

A martensitic stainless steel alloy for a razor blade substrate exhibits both high corrosion resistance and high hardness. However, inevitably the resultant high brittleness in this steel results in cracking and fracturing in blades other than flat types.

A softer steel may be used (e.g., to achieve a desired bend radius for a blade of the bent type), however, this solution also has drawbacks for blades. Blades manufactured from softer steels often do not have the necessary edge strength for a durable cutting edge for a close and comfortable shave. In addition, blades made from softer steels may have edges with increased failures where portions of the edge fall off or tear away (e.g., tear outs).

A robust razor blade substrate type and shape (e.g., martensitic stainless steel) for a razor blade is desired that exhibits high hardness and resistance to corrosion, but with decreased brittleness so as to not compromise the robustness of the razor blade, its edge, and its shaving attributes. For instance, a shape that is effective at reducing the cutter force needed to cut hair and a substrate that is effective at improving durability will lead to a more comfortable shave.

SUMMARY

The present invention provides a razor blade comprising a substrate. The substrate has a cutting edge being defined by a sharpened blade tip. The substrate has a Molybdenum (Mo) content of about 1% to about 5% by weight of composition. The substrate has a thickness of between about 1.60 and 1.75 micrometers measured at a distance of four micrometers from the blade tip, and a thickness of between about 9.25 and 10.00 micrometers measured at a distance of forty micrometers from the blade tip. The substrate has a ratio of the thickness measured at four micrometers to the thickness measured at forty micrometers between 0.165 and 0.185. The substrate has a thickness of between about 2.70 and 3.00 micrometers measured at a distance of eight micrometers from the blade tip, a thickness of between about 4.44 and 5.00 micrometers measured at a distance of sixteen micrometers from the blade tip, a ratio of thickness measured at four micrometers to the thickness measured at eight micrometers between 0.56 and 0.62, and a ratio of thickness measured at four micrometers to the thickness measured at sixteen micrometers between 0.32 and 0.40.

The razor blade of the present invention comprises a cross-sectional shape of the blade edge defined by the equation $w = ad^n$, in which "w" is the thickness in micrometers of the blade tip at a distance "d" in micrometers from the blade tip, wherein "a" is a proportionality factor in the range of 0.50 to 0.62, and "n" is in the range of 0.76 to 0.80.

The razor blade substrate includes about 1.8% to about 3% Mo by weight of composition. The substrate further includes a steel of about 0.35% to about 0.7% C and about 12% to about 14% Cr.

Alternatively, the razor blade substrate further includes an amount of Carbon (C) ranging from about 0.45% to about 0.55% by weight percent of composition, an amount of Chromium (Cr) ranging from about 12% to about 14% by weight percent of composition, an amount of Silicon (Si) ranging from about 0.4% to about 1.0%, an amount of Manganese (Mn) ranging from about 0.5% to about 1.0%, with the balance in weight percent of composition made up of an amount of Iron (Fe) and unavoidable impurities, or any combination thereof.

The razor blade is preferably comprised of a substrate that is a martensitic stainless steel. The razor blade substrate may have a carbide density of at least 150 carbides or more per 100 square micrometers as determined by optical microscopic cross-section.

The razor blade may comprise an interlayer joined to the substrate. The interlayer preferably comprises niobium, chromium, platinum, titanium, or any combination or alloys thereof. The razor blade may comprise a coating layer joined to the interlayer. The coating layer may comprise a material containing carbon, chromium, platinum, nitrides, aluminum, titanium, nitrogen, oxides, or any combination thereof.

The razor blade may or may not comprise an overcoat layer joined to the coating layer. The overcoat layer preferably comprises chromium. The razor blade may comprise an outer layer joined to the overcoat layer or to the hard coating. The outer layer preferably comprises a polymer, which may comprise polytetrafluoroethylene.

Preferably, the coated substrate has a tip radius of from about 125 to about 500 angstroms.

The razor blade may comprise a semi-included angle that is less than 7 degrees. The semi-included angle is desirably measured at a distance of forty micrometers or greater from the blade tip.

The razor blade substrate may include only two facets on each side of said cutting edge.

The razor blade may include a nitride region disposed at or beneath a surface of the substrate which may be formed by plasma nitriding. One or more layers may be joined to the nitrided substrate.

The razor blade substrate may have a bent portion. The razor blade substrate may include substantially no cracks in the bent portion.

The coated substrate, after shaving, may have about 50 percent less tear outs along the coated blade edge relative to a similar blade edge having a narrower substrate thickness at a distance of four micrometers from the blade tip.

DESCRIPTION OF DRAWINGS

While the specification concludes with claims particularly pointing out and distinctly claiming the subject matter that is regarded as the present invention, it is believed that the invention will be more fully understood from the following description taken in conjunction with the accompanying drawings.

DETAILED DESCRIPTION

The present invention encompasses a substrate comprising about 1.6% to about 5% Mo by weight of composition with a cutting edge being defined by a sharpened tip, said substrate having a thickness of between about 1.60 and 1.75 micrometers measured at a distance of four micrometers from the blade tip, and a thickness of between about 9.25 and 10.00 micrometers measured at a distance of forty micrometers from the blade tip.

The blade edge profile and substrate material of the present invention significantly increase the strength and durability of the blade edges and allows for formable blades with improved longevity during shaving. In addition, beneficially the coated blade edge failure or damage analyzed after shaving is generally reduced by about 50 percent relative to a blade edge with a similar cutting force and coatings but a narrower substrate thickness at a distance of four micrometers from the blade tip. Analyzing tear outs or pieces of the edge that have been removed are one manner of determining failure or damage along the blade edge. It has been determined that an average number of tear outs seen along the edge of coated razor blades of the prior art is about 9.7 while coated blades of the present invention average 3.5 tear outs along the edge of the razor blades. This amounts to the novel blade edges having about less than half the number of tear-outs of the prior art edges (e.g., roughly half of total edge removed).

Figure 1:
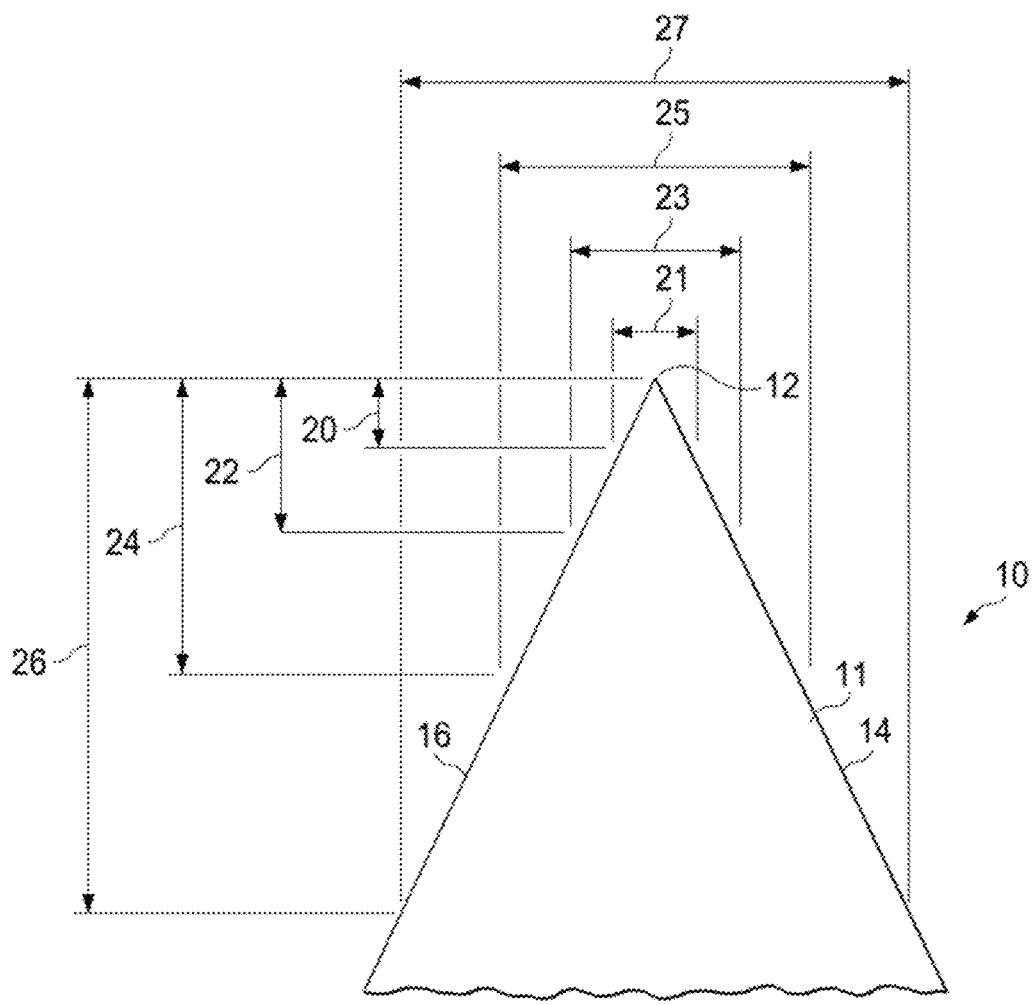
FIG. 1 is a diagrammatic view illustrating a blade substrate.

Referring now to FIG. 1, there is shown a razor blade 10. The razor blade 10 includes stainless steel body portion or substrate 11 with a wedge-shaped sharpened edge (or cutting edge) having a tip 12. The substrate 11 has a thickness 21 of between about 1.60 and 1.75 micrometers measured at a distance 20 of four micrometers from the blade tip 12.

The substrate 11 has a thickness 23 of between about 2.7 and 3.00 micrometers measured at a distance 22 of eight micrometers from the blade tip 12.

The substrate 11 has a thickness 25 of between about 4.44 and 5.0 micrometers measured at a distance 24 of sixteen micrometers from the blade tip 12.

The substrate 11 has a thickness 27 of between about 9.25 and 10.00 micrometers measured at a distance 26 of forty micrometers from the blade tip 12.

The substrate 11 has a ratio of thickness 21 measured at four micrometers from the tip 12 to the thickness 27 measured at forty micrometers from the tip 12 of between 0.165 and 0.185.

The substrate 11 has a ratio of thickness 21 measured at four micrometers from the tip 12 to the thickness 23 measured at eight micrometers from the tip 12 of between 0.56 and 0.62.

The substrate 11 has a ratio of thickness 21 measured at four micrometers from the tip 12 to the thickness 25 measured at sixteen micrometers from the tip 12 of between 0.32 and 0.40.

Table 1 below outlines the values contemplated in the present invention. The units for distance and thickness are micrometers.

TABLE 1

| distance from the blade tip | blade thickness |
|---|---|
| 4 | 1.60-1.75 |
| 8 | 2.70-3.00 |
| 16 | 4.44-5.00 |
| 40 | 9.25-10.00 |
| ratio of distances from tip | ratio of thickness |
| T4/T8 | 0.56-0.62 |
| T4/T16 | 0.32-0.40 |
| T4/T40 | 0.165-0.185 |

The thicknesses and ratios of thicknesses provide a framework for improved shaving. The thicknesses and ratios of thickness provide a balance between edge strength and low cutting force or sharpness. A substrate having smaller ratios will have inadequate strength leading to ultimate edge failure. A substrate having greater thicknesses will have a higher cutting force leading to an increased tug and pull and increased discomfort for the user during shaving.

In accordance with the present invention, a cross-sectional shape of blade 10 in the region described in FIG. 1 may be defined by the equation $w = ad^n$, in which "w" is the thickness in micrometers of the substrate at a distance "d" in micrometers from the blade tip 12 and in which the variable "a" is a proportionality factor that has a value in the range of 0.50 to 0.62, and the variable "n" is an exponent that has a value which may be in the range of 0.76 to 0.80 for improved edge attributes such as strength, durability, and cutting performance.

Figure 2:
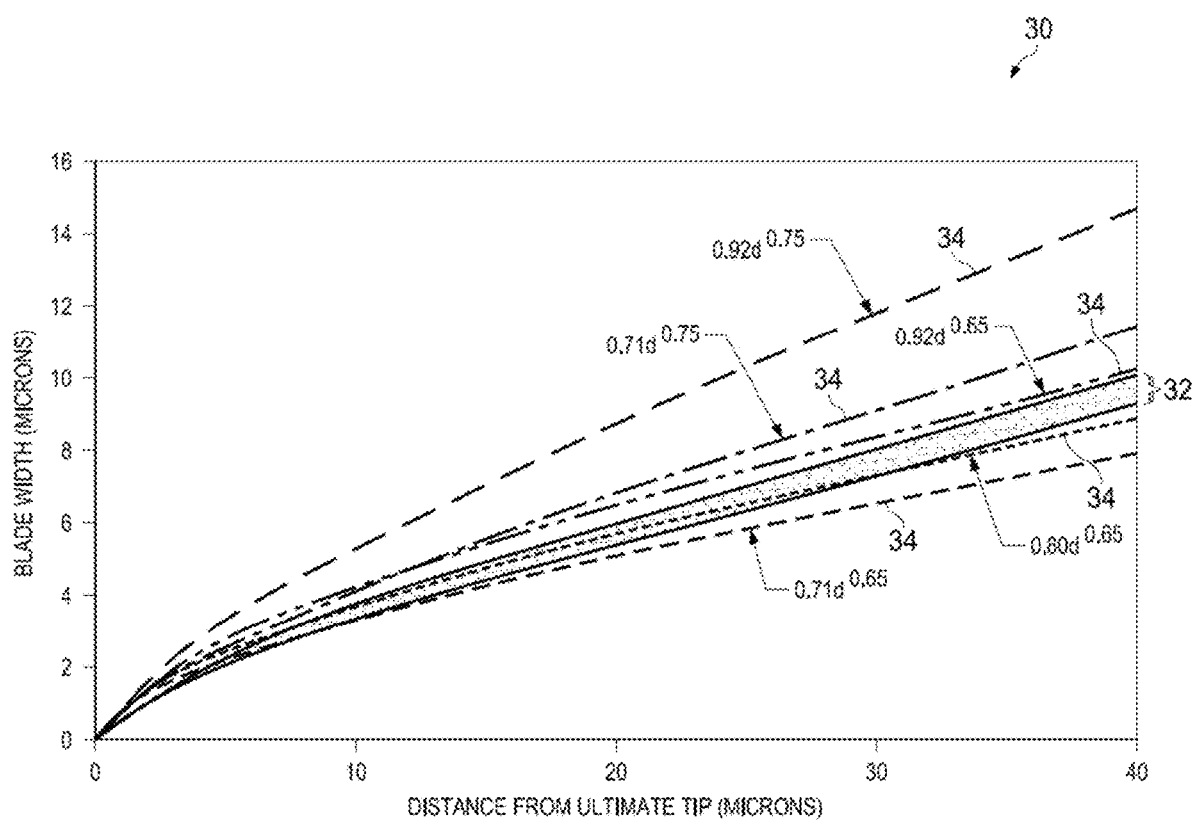
FIG. 2 is a graph illustrating the edge profile of a razor blade.

A graph 30 of the $w = ad^n$ equation with "a" in the range of 0.50 to 0.62 and "n" in the range of 0.76 to 0.80 of the present invention is shown in FIG. 2 applying the range of values of thicknesses and distances of FIG. 1 as discussed above.

Area 32 represents the edge profile of the present invention, while the remaining lines 34 illustrate the different edge profiles described in prior art ranges of "a" and "n" and in particular, U.S. Pat. No. 4,720,918. As can be seen from the graph 30, area 32 represents a novel shape over the prior art.

Substrate 11 may be a stainless steel material of any type to facilitate producing an appropriately sharpened edge. The stainless steel of the present invention may preferably be a stainless steel comprising about 1% to about 5% Molybdenum (Mo) by weight of composition, more preferably about 1.6% to about 5% Mo by weight of composition, most preferably about 2.1% to about 2.8% Mo by weight of composition. In addition to the Mo, the stainless steel may desirably comprise about 0.35% to about 0.7% Carbon (C) and about 12% to about 14% Chromium (Cr).

The razor blade alternately may comprise an amount of Carbon (C) ranging from about 0.45% to about 0.55% by weight percent of composition, an amount of Chromium (Cr) ranging from about 12% to about 14% by weight percent of composition, an amount of Silicon (Si) ranging from about 0.4% to about 1.0%, an amount of Manganese (Mn) ranging from about 0.5% to about 1.0%, with the balance in weight percent of composition made up of an amount of Iron (Fe) and unavoidable impurities, or any combination thereof.

The stainless steel of the present invention may desirably be a martensitic stainless steel.

While it is generally known that the presence of Molybdenum (Mo) in steel substrates significantly increases the resistance to both uniform and localized corrosion and assists with increasing hardness, the present invention steel composition for a razor blade substrate, with its increased Mo content (up to about 5% by weight of composition), also surprisingly provides for improved ductility in the steel which in turn has a unexpected effect of suppressing the formation of cracks in the steel. This is a benefit for forming razor blades. For example, there is a particular benefit for bent blades.

Increasing ductility or softness, as mentioned above in the Background of the Invention section, is generally not desired in the prior art since often softer steel compositions often do not have the necessary edge strength for a close and comfortable shave.

The term "ductility" or "ductile" as used herein signifies the ability of a material to deform plastically before fracturing or cracking. Ductile materials may generally be malleable or easily molded or shaped. For blades, a process which can generally assess the ductility of a razor blade steel is a bending process with a bend-to-fail type instrument by measuring values for the peak breaking angle and the amount of energy it takes to break or bend the steel blade. A detailed description of the razor blade steel having a substrate comprising an amount of Molybdenum (Mo) ranging from about 1.6% to about 5% by weight of composition, a bending process and analysis of cracking, is disclosed in pending U.S. application Ser. No. 14/737,074, entitled "Razor Blade Steel" assigned to the Assignee hereof and incorporated by reference herein.

The term "crack" as used herein can be understood as signifying a "macro crack" or a "micro crack." While a "macro" crack generally refers to a type of crack that is visible with the naked eye or with low magnification, usually about 50× but not to exceed 100×, a "micro" crack generally refers to a crack that can only be seen under a high magnification, generally greater than 100× or 200×. A macro crack may also tend to be longer and extend deeper into a substrate when compared to a micro crack.

It was found that as the amount of Mo was increased, the carbide precipitation ($M_3C$) decreased and surprisingly improved the ductility of the steel without compromising its high hardness and mechanical strength. The workability or ductility of the steel material, after quenching and tempering, it was determined, can be improved by modifying the steel composition so as to decrease the amount of $M_3C$ formed at the crystal grain boundary. This is an improvement for razor blades as the fracturing and cracks are reduced after hardening steps. For blades of the bent type, the bending workability is also improved and cracks are reduced.

In particular, with Mo content larger than 1.6%, and preferably with Mo larger than 2.1%, the Mo desirably suppresses tempered carbide ($M_3C$ formation) and reduces the size of the tempered carbide to 0.1 µm or smaller during heat treatment processes. It was realized that Molybdenum (Mo), being an element that is capable of forming carbide on its own, is hardly dissolved in $M_3C$, where M is a metal element such as Fe, Cr or Mo.

While the embodiments of the present invention focus on compositions with the above elements for practical purposes, the present invention contemplates that the elements, with the exception of the Mo, may be modified in amount, type, and in weight percent. For instance, the substrate may comprise substantially only C, Cr, and Si, in addition to the Mo within the novel range of 1.6% to 5%.

Additionally, the martensitic stainless steel may contain smaller, more finely distributed carbides, but with similar overall carbon weight percent. A fine carbide substrate provides for harder and more brittle after-hardening substrates, and enables the making of a thinner, stronger edge. An example of such a substrate material is a martensitic stainless steel with a finer average carbide size with a carbide density of at least about 150 carbides per 100 square micrometer, more preferably at least about 300 carbides per 100 square micrometer and most preferably at least about 400 carbides or more per 100 square micrometers as determined by optical microscopic cross-section.

Figure 3:
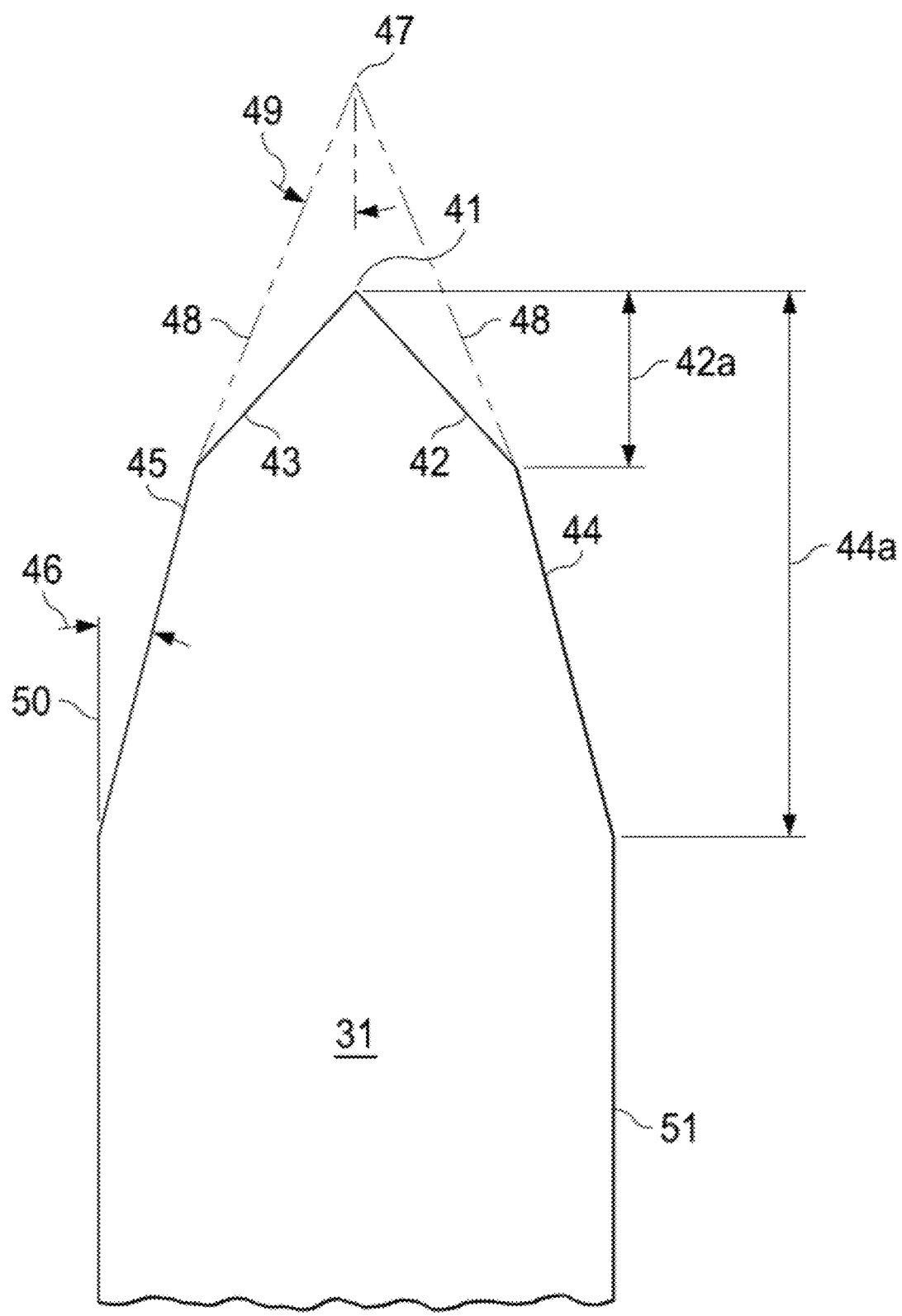
FIG. 3 is a diagrammatic view illustrating a blade substrate.

As discussed above, facets 14 and 16 of FIG. 1 of the wedge-shaped edge of blade 10 diverge from tip 12. In accordance with an alternate preferred embodiment of the present invention, each edge of the wedge-shaped edge of the razor blade of the present invention may also include an additional facet. Turning to FIG. 3, blade 40 of the present invention is shown having a substrate 31 with just two facets on each side or edge. First facets 44, 45 on either edge may generally initially be formed and by known methods. It is desirable to thin the steel to form a robust, durable edge. Grinding is likely the most preferred method as it does not compromise the substrate hardness once the edge is formed. Similarly, second facets 42, 43 may subsequently be formed such that they define the final blade tip 41 (e.g., the facets 42, 43 diverge from tip 41). The second facets 42, 43 may have a distance 42*a* back from the blade tip 41 of about 12 to 50 micrometers. It is noted that a two-stage grinding process may more preferably produce the first and second facets of the present invention. In some applications, a three-stage grinding process, producing a third facet, may be used.

Thus, the present invention contemplates that a sixteen and/or forty micrometer distance from the blade tip 41 may either be disposed within the second facets 42, 43 or within the first facets 44, 45.

First facets 44, 45 generally define semi-included angle 46 (and/or semi-included angle 49) which may preferably be below 7 degrees, more preferably between 4-6 degrees, and most preferably about 6 degrees. Semi-included angle 49, as shown, may be determined as half the included angle formed between the intersection 47 of extended lines 48 (shown as extending from first facets 44, 45 in dotted lines) of first facets 44, 45 prior to second facets 42, 43 being formed. It should be noted that lines 48 are not part of the substrate 31, serving only to illustrate how the semi-included angle is determined. Semi-included angle 46 may alternately be determined by the angle disposed between a perpendicular line or extension 50 of the blade body 51 to the first facet 44 or 45. Though illustrated at two different locations in the razor, these semi-included angles are intended to be substantially identical (e.g., semi-included angle 46 is generally the same value as semi-included angle 49) as they generally represent the same geometry. These angles are also sometimes referred to as half-included angles by those of skill in the art.

The first facets 44, 45 may generally extend a distance 44a of about 175 to about 400 micrometers back from the blade tip 41.

Thus, the present invention contemplates a semi-included angle of less than 7 degrees in the region of the blade having a distance greater than or equal to 40 micrometers back from the blade tip.

Alternately, the present invention preferably contemplates a semi-included angle of less than 7 degrees where the razor blade includes only two facets on each side or edge of the razor blade.

The thicknesses and ratios of thicknesses provide a framework for improved shaving. The thicknesses and ratios of thickness provide a balance between edge strength and low cutting force or sharpness. A substrate having smaller ratios will have inadequate strength leading to ultimate edge failure. A substrate having greater thicknesses will have a higher cutting force leading to an increased tug and pull and increased discomfort for the user during shaving.

A reduced semi-included angle allows the blades to be slimmer further back on the blade from the tip (e.g., at or beyond the 16 micrometers back from the blade tip region and particularly in the region of 40 to 100 micrometers range back from the blade tip). This, with the geometry (e.g., thicknesses and ratios of thicknesses, etc.) described above, provides a unique combination of sharpness and strength, not recognized in the art.

Figure 4:
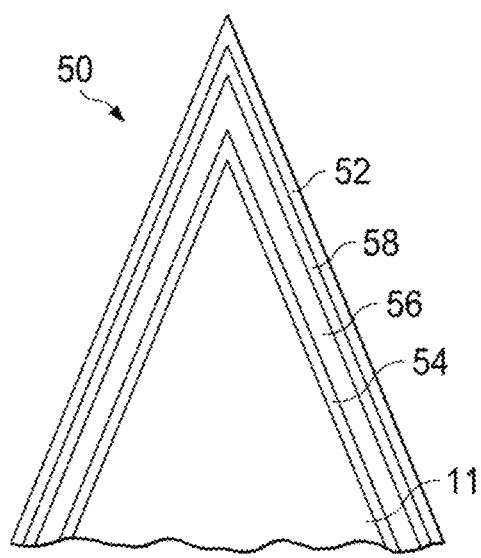
FIG. 4 is a diagrammatic view illustrating a blade substrate with coatings disposed thereon in an embodiment of the present invention.

Referring now to FIG. 4, there is shown a finished first blade 50 of the present invention including a substrate (e.g., substrate 11 of FIG. 1 depicted), interlayer 54, hard coating layer 56, overcoat layer 58, and outer layer 52. The substrate 11 is typically made of stainless steel though other materials can be employed. An example of a razor blade having a substrate, interlayer, hard coating layer, overcoat layer and outer layer is described in U.S. Pat. No. 6,684,513.

Interlayer 54 is used to facilitate bonding of the hard coating layer 56 to the substrate 11. Examples of suitable interlayer material are niobium, chromium, platinum, titanium, or any combination or alloys thereof. A particular interlayer is made of niobium greater than about 100 angstroms and preferably less than about 500 angstroms thick. The interlayer may have a thickness from about 150 angstroms to about 350 angstroms. PCT 92/03330 describes use of a niobium interlayer.

Hard coating layer 56 provides improved strength, corrosion resistance and shaving ability and can be made from fine-, micro-, or nano-crystalline carbon-containing materials (e.g., diamond, amorphous diamond or DLC), nitrides (e.g., boron nitride, niobium nitride, chromium nitride, zirconium nitride, or titanium nitride), carbides (e.g., silicon carbide), oxides (e.g., alumina, zirconia) or other ceramic materials (including nanolayers or nanocomposites). The carbon containing materials can be doped with other elements, such as tungsten, titanium, silver, or chromium by including these additives, for example in the target during application by sputtering. The materials can also incorporate hydrogen, e.g., hydrogenated DLC. Preferably coating layer 56 is made of diamond, amorphous diamond or DLC. A particular embodiment includes DLC less than about 3,000 angstroms, preferably from about 500 angstroms to about 1,500 angstroms. DLC layers and methods of deposition are described in U.S. Pat. No. 5,232,568. As described in the "Handbook of Physical Vapor Deposition (PVD) Processing, "DLC is an amorphous carbon material that exhibits many of the desirable properties of diamond but does not have the crystalline structure of diamond."

The coating layer may comprise a material containing carbon, chromium, platinum, nitrides, aluminum, titanium, nitrogen, oxides, or any combination thereof.

Overcoat layer 58 is used to reduce the tip rounding of the hard coated edge and to facilitate bonding of the outer layer to the hard coating while still maintaining the benefits of both. Overcoat layer 58 is preferably made of chromium containing material, e.g., chromium or chromium alloys or chromium compounds that are compatible with polytetrafluoroethylene, e.g., CrPt. A particular overcoat layer is chromium about 100-200 angstroms thick. Overcoat layer may have a thickness of from about 50 angstroms to about 500 angstroms, preferably from about 100 angstroms to about 300 angstroms. Razor blade 10 has a cutting edge that has less rounding with repeated shaves than it would have without the overcoat layer.

Outer layer 52 is generally used to provide reduced friction. The outer layer 52 may be a polymer composition or a modified polymer composition. The polymer composition may be polyfluorocarbon. A suitable polyfluorocarbon is polytetrafluoroethylene sometimes referred to as a telomer. A particular polytetrafluoroethylene material is Krytox LW 2120 available from Chemours, formerly DuPont. This material is a nonflammable and stable dry lubricant that consists of small particles that yield stable dispersions. It is furnished as an aqueous dispersion of 20% solids by weight and can be applied by dipping, spraying, or brushing, and can thereafter be air dried or melt coated. The layer is preferably less than 5,000 angstroms and could typically be 1,500 angstroms to 4,000 angstroms, and can be as thin as 100 angstroms, provided that a continuous coating is maintained. Provided that a continuous coating is achieved, reduced telomer coating thickness can provide improved first shave results. U.S. Pat. Nos. 5,263,256 and 5,985,459, which are hereby incorporated by reference, describe techniques which can be used to reduce the thickness of an applied telomer layer.

Razor blade 50 is made generally according to the processes described in the above referenced patents. A particular embodiment includes a niobium interlayer 54, DLC hard coating layer 56, chromium overcoat layer 58, and Krytox LW2120 polytetrafluoroethylene outer coat layer 52. Chromium overcoat layer 58 is deposited to a minimum of 100 angstroms and a maximum of 500 angstroms. Razor blade 50 more preferably has a tip radius of about 125 to about 500 angstroms, more preferably 200 to about 400 measured by SEM after application of overcoat layer 58 and before adding outer layer 52.

Figure 5:
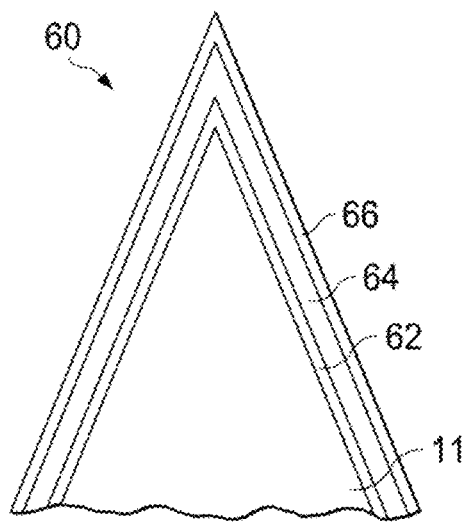
FIG. 5 is a diagrammatic view illustrating a blade substrate with coatings disposed thereon in an alternate embodiment of the present invention.

Another embodiment depicted in FIG. 5 shows a finished blade 60 of the present invention having a substrate (e.g. substrate 11 of FIG. 1, depicted, or substrate 31 of FIG. 3) having an interlayer 62, preferably chromium, a hard coating layer, which may or may not include dopants, and a polytetrafluoroethylene outer coat layer 66 (e.g., Krytox LW2120). Hard coatings such as aluminum magnesium boride based coatings are described in U.S. Patent Publication No. 2013/0031794, assigned to the Assignee hereof and incorporated by reference herein. In FIG. 5, the outer layer 66, which generally is comprised of the same type of material as outer layer 52, described above in FIG. 4, is deposited directly on the hard coating layer 64, as no overcoat layer is present in this embodiment.

The substrate profile of the razor blade of the present invention provides an improvement in blade sharpness. The blade sharpness may be quantified by measuring cutting force, which correlates with sharpness. Cutting force may be measured by a Single Fiber Cutting test, which measures the cutting forces of the blade by measuring the force required by each blade to cut through a single hair. The cutting force of each blade is determined by measuring the force required by each blade to cut through a single human hair. Each blade cuts the hair greater than 50 times and the force of each cut is measured on a recorder. A control blade population is often used with intermittent cuts, to determine a more reliable cutting force comparison. The hair being cut is fully hydrated. Cut speed is 50 millimeters per second. The blade tip offset from the "skin plane" is 100 micrometers. The blade angle relative to the "skin plane" is generally about 21.5 degrees. The hair orientation relative to the "skin plane" is 90 degrees. The data acquisition rate is 180 kHz. This type of cutting force testing process is described in US Patent Publication No. 20110214493, assigned to the Assignee hereof, and incorporated herein by reference.

The finished or coated blades of the present invention (e.g., blades 50 or 60) have a cutting force of less than about 40 milliNewtons and preferably less than about 35 milliNewtons, for a hair with a diameter near 100 microns. This is considered herein to be a relatively sharp blade.

Figure 6:
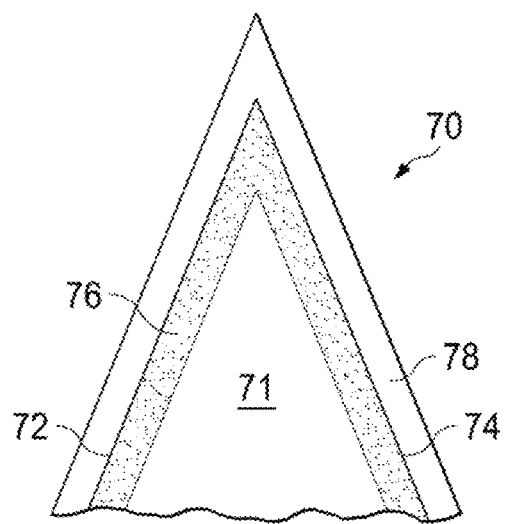
FIG. 6 is a diagrammatic view illustrating a blade substrate with a nitrided region in an alternate embodiment of the present invention.

FIG. 6 depicts an alternate embodiment of the present invention having a blade substrate 71, facets 72 and 74, with the geometries described above in conjunction with FIG. 1-3, and a nitride region 76 at or beneath the surface of the substrate which is formed as a result of a nitriding process step. The nitriding process step may comprise plasma nitriding to form the nitride region 76. The nitride region provides a strengthening to the substrate close to the edge and this extra strength is particularly useful with the blade profile of the present invention. If desired, one or more layers 78 may be joined to the nitrided substrate 71. One layer 78 is shown in FIG. 6. Layer 78 may comprise a polymer much like outer layer 52 or outer layer 66 described above. One type of nitriding process is described in U.S. Patent Publication No. 2010/0299931A1, assigned to the Assignee hereof and incorporated by reference herein.

Figure 7:
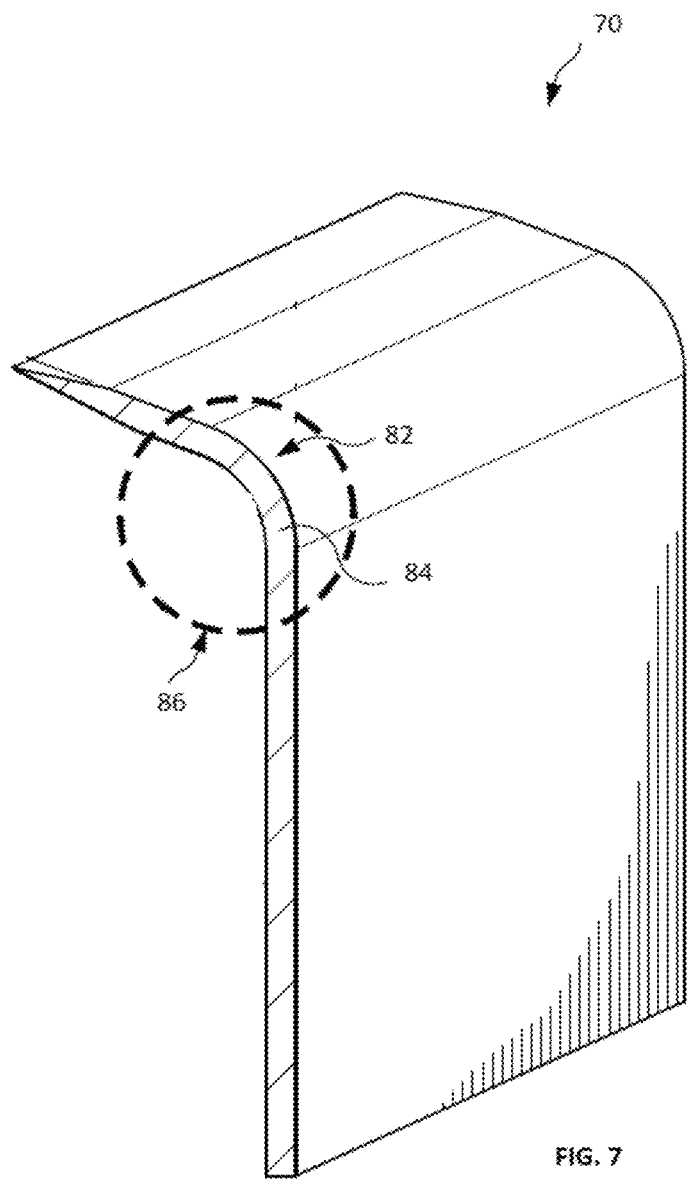
FIG. 7 is a diagrammatic view illustrating a bent blade.

FIG. 7 depicts a razor blade 82 of the bent type of the present invention having a bent portion 84 in a bend zone 86.

Figure 8:
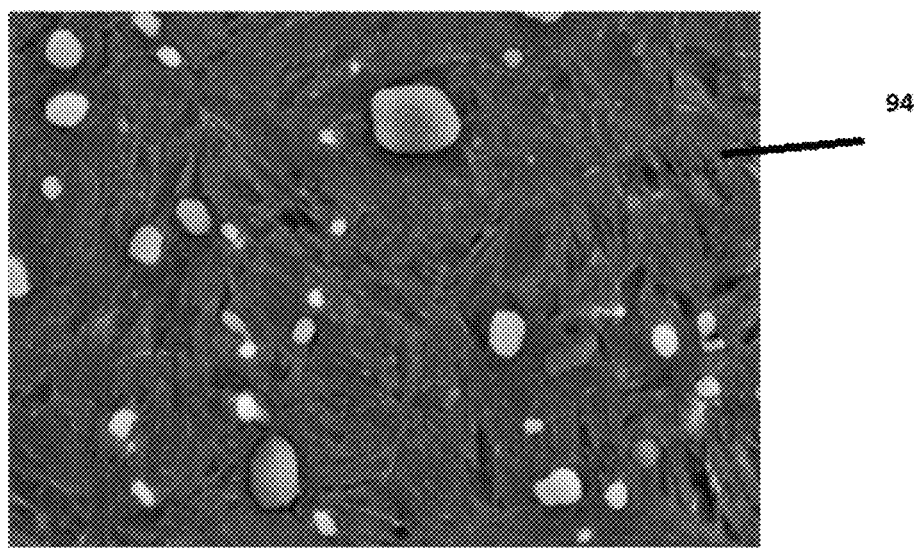
FIG. 8 is an electron micrograph showing the metal structure of a razor blade of the present invention.

FIG. 8 is an electron micrograph at a magnification of 5000× showing a portion of a tensile surface 94 of a bent portion in a bend zone of a typical metal structure of a razor blade 82 of the bent type after undergoing both heat treatment and bending processes where the bend angle is about 70 degrees and where the substrate has a novel Mo content of 2.61%. As can be seen in FIG. 8, there are no cracks generated as the tensile surface 94 appears smooth. The appearance of smoothness may generally be attributed to the fact that the surface contains a reduced amount of imperfections, such as cracks, boundaries, roughness, or other irregularities. A detailed description of the razor blade steel having a substrate comprising an amount of Molybdenum (Mo) ranging from about 1.6% to about 5% by weight of composition, a bending process and analysis of cracking, is disclosed in pending U.S. application Ser. No. 14/737,074, entitled "Razor Blade Steel" assigned to the Assignee hereof and incorporated by reference herein.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 micrometers" is intended to mean "about 40 micrometers."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A razor blade comprising:
a substrate comprising 1% to 5% Mo, by weight of composition, with a cutting edge being defined by a sharpened tip, said substrate having a thickness of between 1.60 and 1.75 micrometers measured at a distance of four micrometers from the blade tip, and a thickness of between 9.25 and 10.00 micrometers measured at a distance of forty micrometers from the blade tip, said substrate further comprising a body, a first pair of facets, and a second pair of facets, wherein the second pair of facets diverge from the blade tip to a distance of 12 to 50 micrometers and the first pair of facets extend between the body and the second pair of facets such that each facet of the second pair of facets intersects with a corresponding facet of the first pair of facets, the first pair of facets defining a semi-included angle that is less than 7 degrees when measured at a distance of forty micrometers or greater from the blade tip, wherein the semi-included angle is defined by (i) half of an included angle formed between extended lines of the first pair of facets, or (ii) an intersection of an extended line of the body and one of the facets of the first pair of facets.

2. The razor blade of claim 1, further comprising a ratio of the thickness measured at four micrometers to the thickness measured at forty micrometers between 0.165 and 0.185.

3. The razor blade of claim 1, wherein said substrate has a thickness of between 2.70 and 3.00 micrometers measured at a distance of eight micrometers from the blade tip, a thickness of between 4.44 and 5.00 micrometers measured at a distance of sixteen micrometers from the blade tip, a ratio of thickness measured at four micrometers to the thickness measured at eight micrometers between 0.56 and 0.62, and a ratio of thickness measured at four micrometers to the thickness measured at sixteen micrometers between 0.32 and 0.40.

4. The razor blade of claim 1, wherein the substrate comprises 1.8% to 3% Mo by weight of composition.

5. The razor blade of claim 4 wherein the substrate further comprises a steel of 0.35% to 0.7% C and 12% to 14% Cr.

6. The razor blade of claim 1 wherein the substrate further comprises an amount of Carbon (C) ranging from 0.45% to 0.55% by weight percent of composition, an amount of Chromium (Cr) ranging from 12% to 14% by weight percent of composition, an amount of Silicon (Si) ranging from 0.4% to 1.0%, an amount of Manganese (Mn) ranging from 0.5% to 1.0%, with the balance in weight percent of composition comprised of an amount of Iron (Fe), or any combination thereof.

7. The razor blade of claim 1 wherein the substrate is a martensitic stainless steel.

8. The razor blade of claim 1 wherein the substrate has a carbide density of at least 150 carbides or more per 100 square micrometers as determined by optical microscopic cross-section.

9. The razor blade of claim 8 further comprising an interlayer joined to said substrate.

10. The razor blade of claim 9 wherein said interlayer comprises niobium, chromium, platinum, titanium, or any combination or alloys thereof.

11. The razor blade of claim 10, further comprising a coating layer joined to said interlayer.

12. The razor blade of claim 11 wherein said coating layer comprises carbon, silicon carbide, chromium, platinum, boron nitride, niobium nitride, chromium nitride, zirconium nitride, titanium nitride, aluminum, titanium, nitrogen, alumina, zirconia, or any combination thereof.

13. The razor blade of claim 12 further comprising an outer layer joined to said coating layer.

14. The razor blade of claim 12 further comprising an overcoat layer joined to said coating layer.

15. The razor blade of claim 14 wherein said overcoat layer comprises chromium.

16. The razor blade of claim 15 wherein a tip radius of said coated cutting edge is 125 to 500 angstroms.

17. The razor blade of claim 15 further comprising an outer layer joined to said overcoat layer.

18. The razor blade of claim 17 wherein said outer layer comprises a polymer.

19. The razor blade of claim 18 wherein said outer layer comprises polytetrafluoroethylene.

20. The razor blade of claim 1, wherein said substrate has only two facets on each side of said cutting edge.

21. The razor blade of claim 1, further comprising a nitride region disposed at or beneath a surface of the substrate.

22. The razor blade of claim 21, wherein said nitride region is formed by plasma nitriding.

23. The razor blade of claim 21 further comprising one or more layers joined to said nitrided substrate.

24. The razor blade of claim 1 wherein the razor blade comprises a bent portion.

25. The razor blade of claim 24 wherein the substrate comprises substantially no cracks in said bent portion such that the bent portion appears smooth.

* * * * *